(12) United States Patent
Yagishita

(10) Patent No.: US 6,532,179 B2
(45) Date of Patent: Mar. 11, 2003

(54) INPUT SIGNAL RECEIVING CIRCUIT FOR SEMICONDUCTOR INTEGRATED CIRCUIT

(75) Inventor: Yoshimasa Yagishita, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/814,771

(22) Filed: Mar. 23, 2001

(65) Prior Publication Data
US 2001/0026479 A1 Oct. 4, 2001

(30) Foreign Application Priority Data
Mar. 31, 2000 (JP) .................................. 2000-097598

(51) Int. Cl.[7] ................................................ G11C 7/00
(52) U.S. Cl. .................... 365/194; 365/230.01
(58) Field of Search .................. 365/194, 63, 230.01, 365/230.06, 230.08; 257/773, 775

(56) References Cited

U.S. PATENT DOCUMENTS 5,473,195 A * 12/1995 Koike .......................... 257/775
5,724,281 A * 3/1998 Nagaba ........................ 365/63
5,986,943 A * 11/1999 Isa ......................... 365/189.04

* cited by examiner

Primary Examiner—Michael S. Lebentritt
Assistant Examiner—Anh Phung
(74) Attorney, Agent, or Firm—Arent Fox Kintner Plotkin & Kahn, PLLC

(57) ABSTRACT

The semiconductor integrated circuit according to the present invention comprises a plurality of receiving circuits each for receiving a plurality of input signals in synchronization with a timing signal. The input signals supplied to each of the receiving circuits are made equal in propagation delay times from their respective input terminals to the receiving circuit. Since the receiving circuits can receive the input signals of little skew, the timing margin required for the reception is minimized. That is, high speed operation becomes possible. At the same time, because the input signals corresponding to each individual receiving circuit are made equal in propagation delay time, the wiring for transmitting the input signals can be arranged in a minimum area. This can reduce the chip area, with reduction in chip costs.

8 Claims, 6 Drawing Sheets

INPUT SIGNAL RECEIVING CIRCUIT FOR SEMICONDUCTOR INTEGRATED CIRCUIT

BACKGROUND OF THE INVENTION

1. Field of the Invention

The invention relates to a semiconductor integrated circuit which has receiving circuits for receiving input signals supplied from exterior in synchronization with a timing signal such as a clock signal.

2. Description of the Related Art

FIG. 1 shows the essential parts of a semiconductor integrated circuit having a receiving circuit of this type.

This semiconductor integrated circuit is formed, for example, as a DRAM. The DRAM has a plurality of pads 2, input circuits 4 connected to these pads 2, and a latching circuit 6. Aside from the parts shown in the diagram, the DRAM also includes pads for control signals and data signals, control circuits, memory cell arrays, and so on. The pads 2 are respectively supplied with a clock signal CLK and address signals ADD0–ADD5 from chip exterior. The input circuits 4 receive the above-mentioned signals through the pads 2. The signals received are amplified and output to the latching circuit 6. Here, the address signals ADD0–ADD5 are supplied so as to ensure a predetermined setup time or a predetermined hold time for a rising edge of the clock signal CLK. The latching circuit 6 has latches 6a corresponding to the address signals ADD0–ADD5, respectively. The latching circuit 6 accepts the address signals ADD0–ADD5 in synchronization with a rising edge of the clock signal CLK and outputs the accepted signals to internal circuits.

Now, the operating frequencies of DRAMs have recently been on the increase and the above-mentioned setup time and hold time on the decrease. As a result, it has become necessary to lower the in-chip skew of the address signals ADD0–ADD5 so that the address signals ADD0–ADD5 are accepted with reliability. Specifically, as shown in FIG. 1, the wiring patterns of the address signals ADD0–ADD5 extending from the input circuits 4 to the latching circuit 6 were formed to meander for equal lengths. Thus, the address signals ADD0–ADD5 supplied from the pads 2 were transmitted to the latching circuit 6 almost at the same time.

In such a technique, however, the wiring patterns had to be formed in conformity to the longest. Actual DRAMs have a greater number of address signals than those shown in FIG. 1. Besides, the pads for receiving these signals are often arranged in one direction on the chip, with a considerable distance between both end pads. This consequently elongated the wiring patterns for the address signals, giving rise to a problem that these wiring patterns increase in layout area to make the chip size greater. The increase in chip size directly contributes a rise in chip cost. Such a problem arises not only with the address signals but also with the wiring patterns for data signals.

SUMMARY OF THE INVENTION

An object of the present invention is to provide a semiconductor integrated circuit which surely accepts input signals in synchronization with a timing signal without any increase in layout area.

According to one of the aspects of the semiconductor integrated circuit in the present invention, the semiconductor integrated circuit comprises a plurality of receiving circuits each for receiving a plurality of input signals in synchronization with a timing signal. The input signals supplied to each of the receiving circuits are made equal in propagation delay times from their respective input terminals to the receiving circuit. Since the receiving circuits can receive the input signals of little skew, the timing margin required for the reception is minimized. That is, high speed operation becomes possible. At the same time, because the input signals corresponding to each individual receiving circuit are made equal in propagation delay time, the wiring for transmitting the input signals can be arranged in a minimum area. This can reduce the chip area, with reduction in chip costs.

According to another aspect of the semiconductor integrated circuit in the present invention, the propagation delay time is set by equalizing the lengths of wiring patterns through which the input signals are transmitted. Therefore, the propagation delay time of each input signal can be visually set with facility.

According to another aspect of the semiconductor integrated circuit in the present invention, the semiconductor integrated circuit comprises decoders respectively corresponding to the receiving circuits. The decoders decode the input signals received by the receiving circuits. Since the input signals are made equal in propagation delay time by unit of decoding, each of the decoders can receive its input signals with no skew. As a result, it becomes possible to reduce the settling time of the decoder outputs.

According to another aspect of the semiconductor integrated circuit in the present invention, the semiconductor integrated circuit comprises a memory cell array having a plurality of memory cells. Each of the receiving circuits receives, as the input signals, a plurality of address signals for selecting the memory cells. This allows reduction in the settling time of the address decoder outputs.

According to another aspect of the semiconductor integrated circuit in the present invention, the semiconductor integrated circuit comprises internal accepting circuits respectively corresponding to the receiving circuits. The internal accepting circuits accept the input signals received by the receiving circuits, in synchronization with internal timing signals generated in accordance with internal circuit operation. Since the input signals are made equal in propagation delay time by unit of acceptance by the internal accepting circuits, each of the internal accepting circuits can receive its input signals with no skew. This can increase the timing margins for the internal accepting circuits to accept their input signals under the internal timing signals.

According to another aspect of the semiconductor integrated circuit in the present invention, the receiving circuits are each formed corresponding to the destinations of wiring patterns. That is, the input signals can be supplied to internal circuits at an optimum timing in accordance with the layout of the internal circuits.

According to another aspect of the semiconductor integrated circuit in the present invention, the semiconductor integrated circuit comprises a memory cell array having a plurality of memory cells. Each of the receiving circuits receives, as the input signals, data to be written to the memory cells. Therefore, the data can be supplied at an optimum timing in accordance with the on-chip locations of the memory cells. This configuration is effective especially when a plurality of memory cell arrays (or memory cores) each having a plurality of memory cells are formed on a chip and the pieces of data corresponding to these memory cell arrays differ in bit number.

BRIEF DESCRIPTION OF THE DRAWINGS

The nature, principle, and utility of the invention will become more apparent from the following detailed description when read in conjunction with the accompanying drawings in which like parts are designated by identical reference numbers, in which.

DESCRIPTION OF THE PREFERRED EMBODIMENTS

Hereinafter, the embodiments of the present invention will be described with reference to the drawings.

Figure 1:
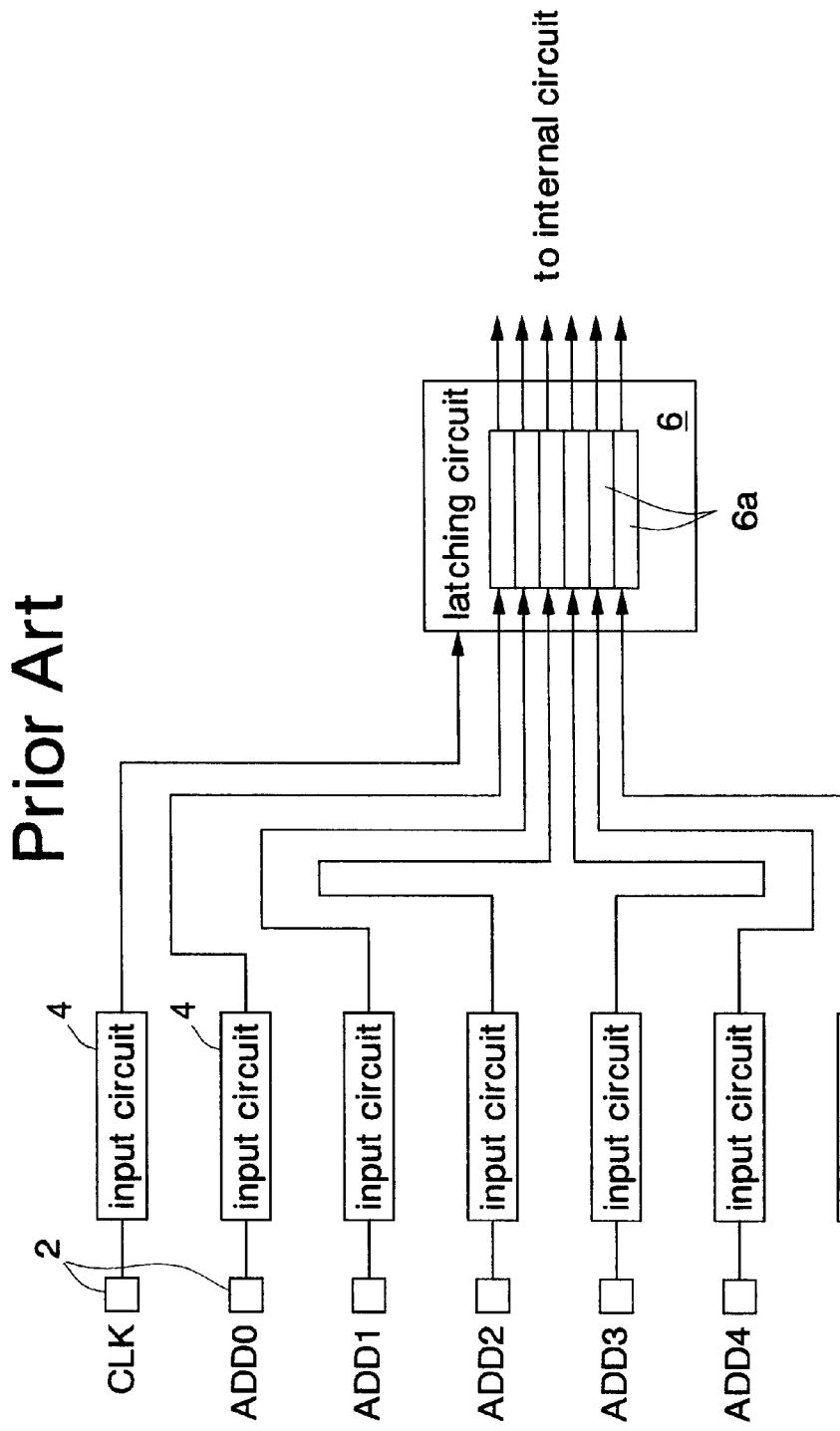
FIG. 1 is a block diagram showing the essential parts of a conventional DRAM.
Figure 2:
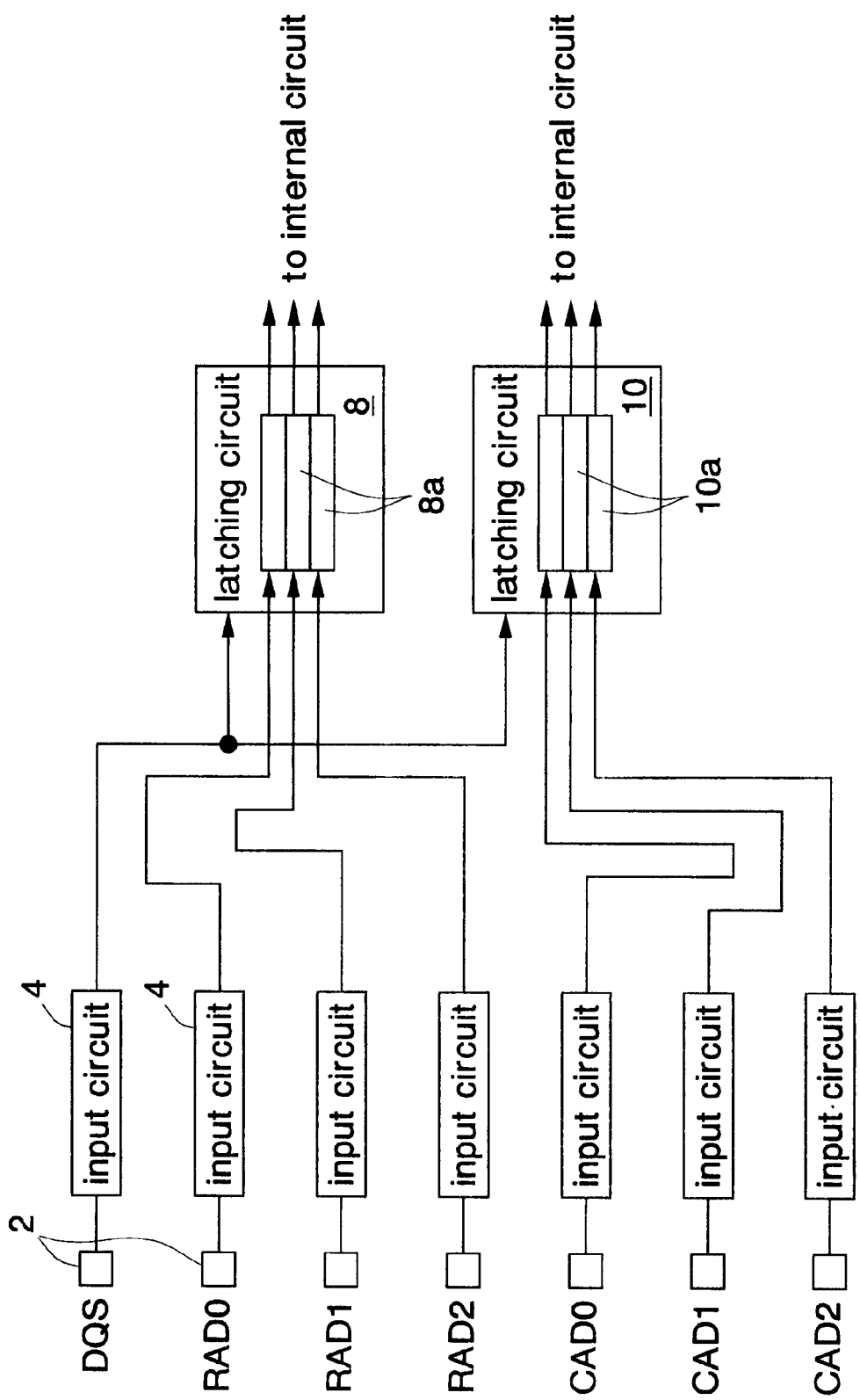
FIG. 2 is a block diagram showing the essential parts of a first embodiment of the semiconductor integrated circuit in the present invention.

FIG. 2 shows a first embodiment of the semiconductor integrated circuit in the present invention. The same circuits and signals as those described in the conventional art will be designated by identical reference numbers, and detailed description thereof will be omitted.

This semiconductor integrated circuit is formed as an FCRAM (Fast Cycle RAM) on a silicon substrate by using CMOS processes. An FCRAM is a memory which receives non-multiplexed address signals (address non-multiplex type) and applies pipeline processing thereto, particularly for the sake of reducing the random-access operating time. That is, row address signals and column address signals are supplied to the chip simultaneously with command input. Besides, internal circuit operations are divided into three stages. Each stage carries out pipeline operations and then returns to its initial state without a wait for any control signal from exterior.

The FCRAM has a plurality of pads 2 (input terminals), input circuits 4 respectively connected to these pads 2, and latching circuits 8 and 10 (receiving circuits for input signals). Aside from those parts shown in the diagram, the FCRAM also includes pads for control signals and data signals, control circuits, memory cell arrays, and so on. The pads 2 are supplied with a clock signal CLK(timing signal), row address signals RAD0–RAD2(input signals), and column signals CAD0–CAD2(input signals) from chip exterior, respectively. The row address signals RAD0–RAD2 are used, for example, to select word lines which control the transfer transistors in memory cells. The column address signals CAD0–CAD2 are used, for example, to select bit lines which are connected to the transfer transistors in the memory cells. The clock signal CLK is used as a timing signal (synchronizing signal) for receiving the address signals. The input circuits 4 receive the above-mentioned signals through the pads 2. The signals received are amplified and output to the latching circuits 8 and 10. The latching circuit 8 has latches 8a corresponding to the row address signals RAD0–RAD2, respectively. The latching circuit 8 accepts the row address signals RAD0–RAD2 in synchronization with a rising edge of the clock signal CLK and outputs the accepted signals to row-address-related internal circuits. The latching circuit 10 has latches 10a corresponding to the column address signals CAD0–CAD2, respectively. The latching circuit 10 accepts the column address signals CAD0–CAD2 in synchronization with a rising edge of the clock signal CLK and outputs the accepted signals to column-address-related internal circuits.

Here, the wiring patterns of the row address signals RAD0–RAD2, extending from the input circuits 4 to the latching circuit 8, are formed to meander for equal lengths. Likewise, the wiring patterns of the column address signals CAD0–CAD2, extending from the input circuits 4 to the latching circuit 10, are formed to meander for equal lengths. That is, the row address signals RAD0–RAD2 from the pads 2 to the latching circuit 8 are identical with each other in propagation delay time. The column address signals CAD0–CAD2 from the pads 2 to the latching circuit 10 are identical with each other in propagation delay time. Therefore, the row address signals RAD0–RAD2 supplied from the pads 2 are transmitted to the latching circuit 8 almost at the same time. The column address signals CAD0–CAD2 supplied from the pads 2 are transmitted to the latching circuit 10 almost at the same time. That is, in this embodiment, the latching circuits 8 and 10 are formed by function of input signals (row address, column address) and the input signals supplied to each of these latching circuits 8 and 10 are made equal in wiring pattern length. This forms wiring patterns of optimum lengths, whereby the wiring patterns decrease in layout area as compared with the conventional art. The wiring patterns change in width, thickness, and parasitic capacitance in keeping with variations in the manufacturing processes. Thus, the amount of relative deviation in the propagation delay time of the wiring patterns is scarcely susceptible to the variations in the manufacturing processes.

Moreover, in this embodiment, the row address signals RAD0–RAD2 are smaller than the column address signals CAD0–CAD2 in wiring pattern length. The wiring pattern length of the column address signals CAD0–CAD2 is the same as heretofore. This requires that the latching circuits 8 and 10 be shifted from each other in accepting timing. This shift, however, has no affect on circuit operations since the latching circuits 8 and 10 are formed by function of input signals. In this example, the transmission time of the clock signal CLK to the latching circuit 8 can be adjusted so that the row address signals RAD0–RAD2 are accepted at timing earlier than heretofore. The earlier acceptance of the row address signals RAD0–RAD2 which need to be supplied to internal circuits earlier allows a reduction in access time.

As has been described above, in the semiconductor integrated circuit of the present embodiment, the latching circuits 8 and 10 are formed by function of input signals, and the input signals supplied to these latching circuits 8 and 10 are made equal in wiring pattern length by function. Therefore the wiring patterns can be reduced in layout area. This consequently allows a reduction in chip size.

In addition, since the propagation delay times of wiring patterns depend on the lengths of the wiring patterns, it is possible to check the propagation delay times visually.

Figure 3:
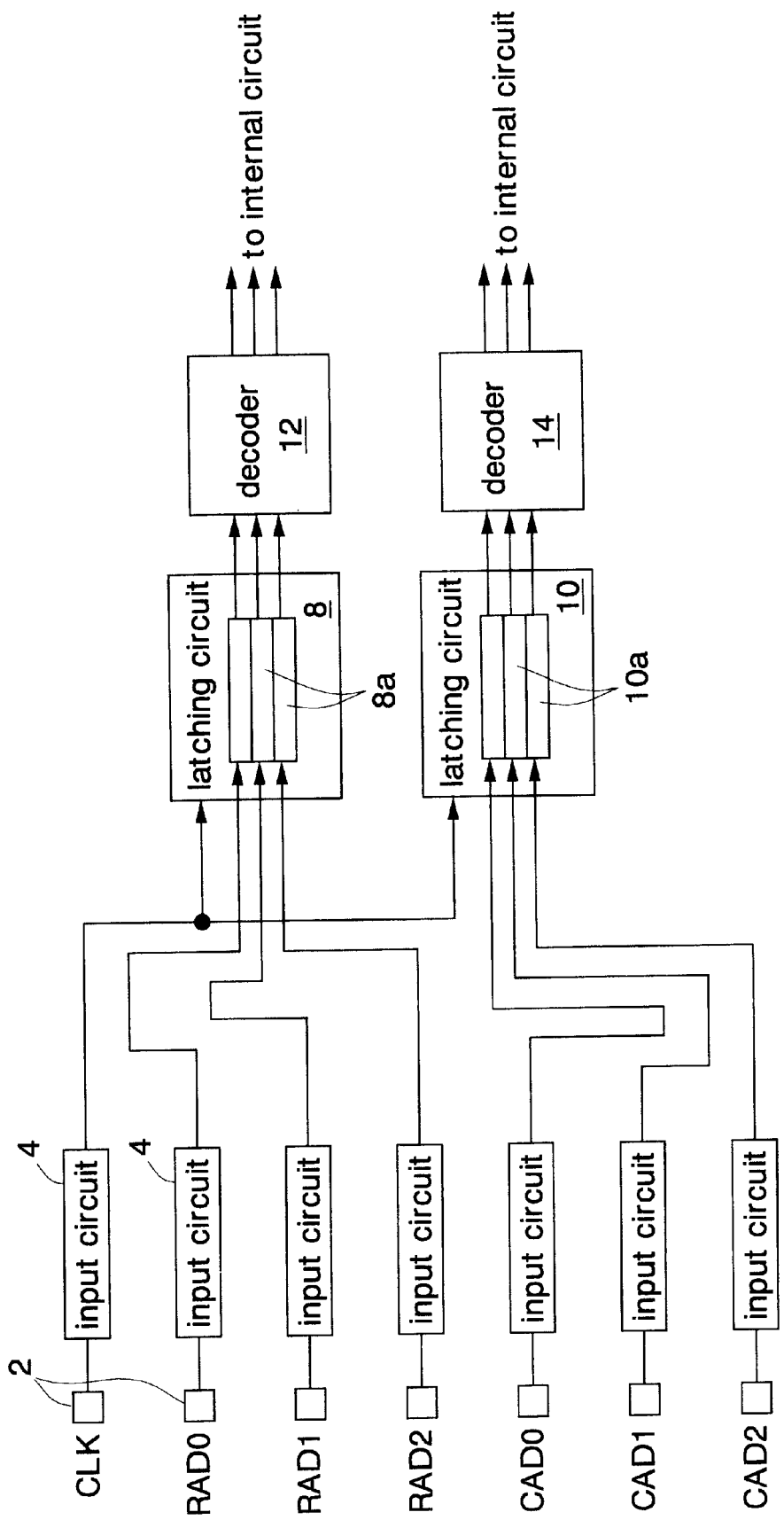
FIG. 3 is a block diagram showing the essential parts of a second embodiment of the semiconductor integrated circuit in the present invention.

FIG. 3 shows a second embodiment of the semiconductor integrated circuit in the present invention. The same circuits and signals as those described in the conventional art and in the first embodiment will be designated by identical reference numbers, and detailed description thereof will be omitted.

This embodiment includes decoders 12 and 14 for receiving the outputs from the latching circuits 8 and 10, respectively. The other configuration is identical to that of the first embodiment described above. The decoder 12 decodes the row address signals RAD0–RAD2 and outputs the decoded signals to the internal circuits. The decoder 14 decodes the column address signals CAD0–CAD2 and outputs the decoded signals to the internal circuits.

That is, in this embodiment, the address signals are made equal in propagation delay time by unit of decoding. This allows the decoders 12 and 14 to receive their address signals with no skew. As a result, the decoders 12 and 14 can settle their outputs in a shorter time, with a reduction in power consumption.

The semiconductor integrated circuit in this embodiment can offer the same effects as those obtained from the first embodiment described above. In particular, according to this embodiment, the decoders 12 and 14 can receive their address signals with no skew. This allows a reduction in the output settling time of the decoders 12 and 14.

Figure 4:
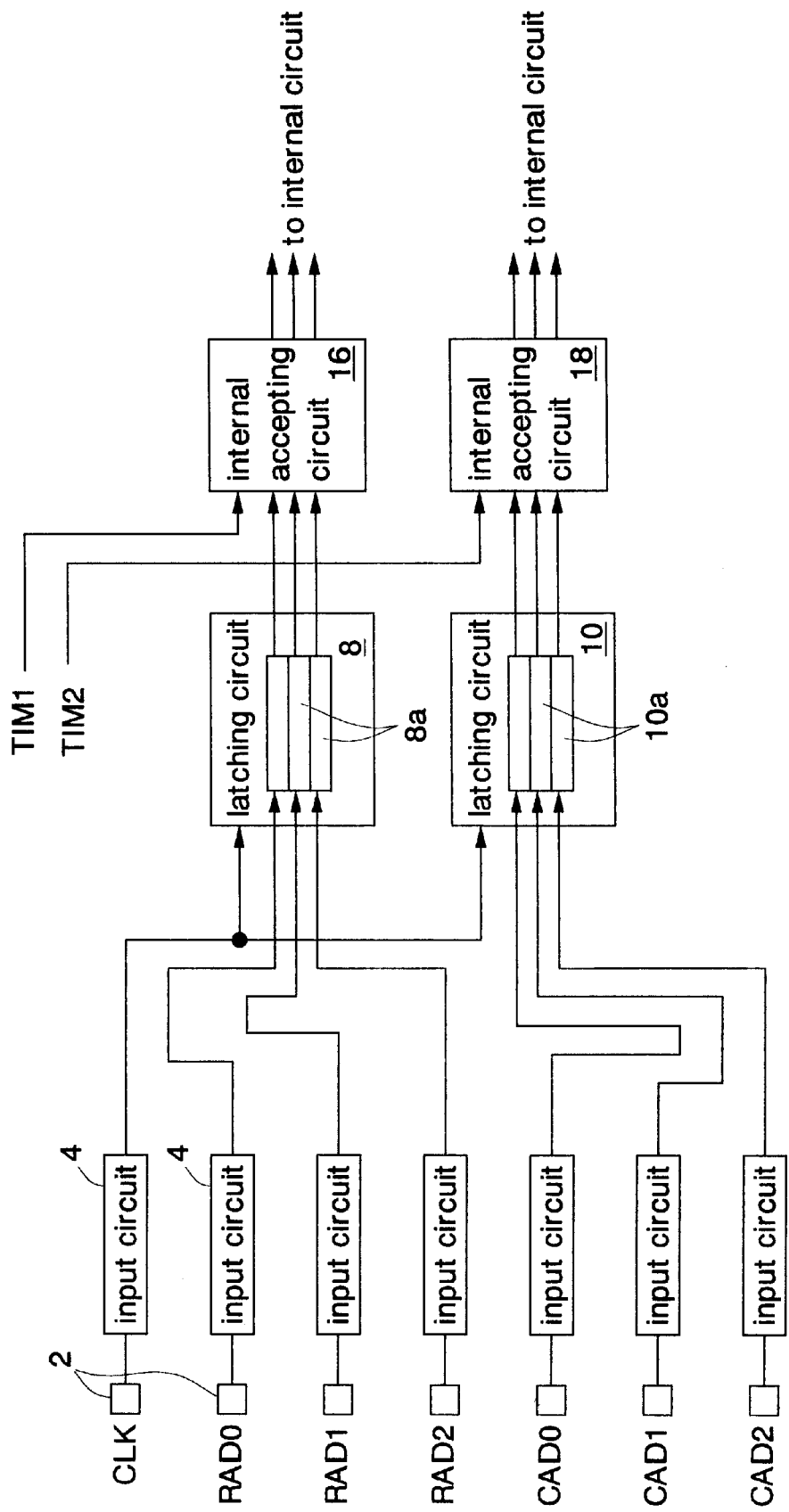
FIG. 4 is a block diagram showing the essential parts of a third embodiment of the semiconductor integrated circuit in the present invention.

FIG. 4 shows a third embodiment of the semiconductor integrated circuit in the present invention. The same circuits and signals as those described in the conventional art and in the first embodiment will be designated by identical reference numbers, and detailed description thereof will be omitted.

In this embodiment, internal accepting circuits 16 and 18 are formed instead of the decoders 12 and 14 in the second embodiment. The internal accepting circuit 16 accepts address signals output from the latching circuit 8, in synchronization with an internal timing signal TIM1, and outputs the accepted signals to the internal circuits. The internal accepting circuit 18 accepts address signals output from the latching circuit 10, in synchronization with an internal timing signal TIM2, and outputs the accepted signals to the internal circuits. The internal timing signals TIM1 and TIM2 are control signals generated in accordance with the operations of the internal circuits.

That is, the address signals are made equal in propagation delay time, by unit of acceptance by the internal accepting circuits 16 and 18. Thus the internal accepting circuits 16 and 18 can receive the address signals with no skew. This can increase the timing margins for the internal accepting circuits 16 and 18 to accept the address signals, corresponding to the internal timing signals.

The semiconductor integrated circuit in this embodiment can offer the same effects as those obtained from the first embodiment described above.

Figure 5:
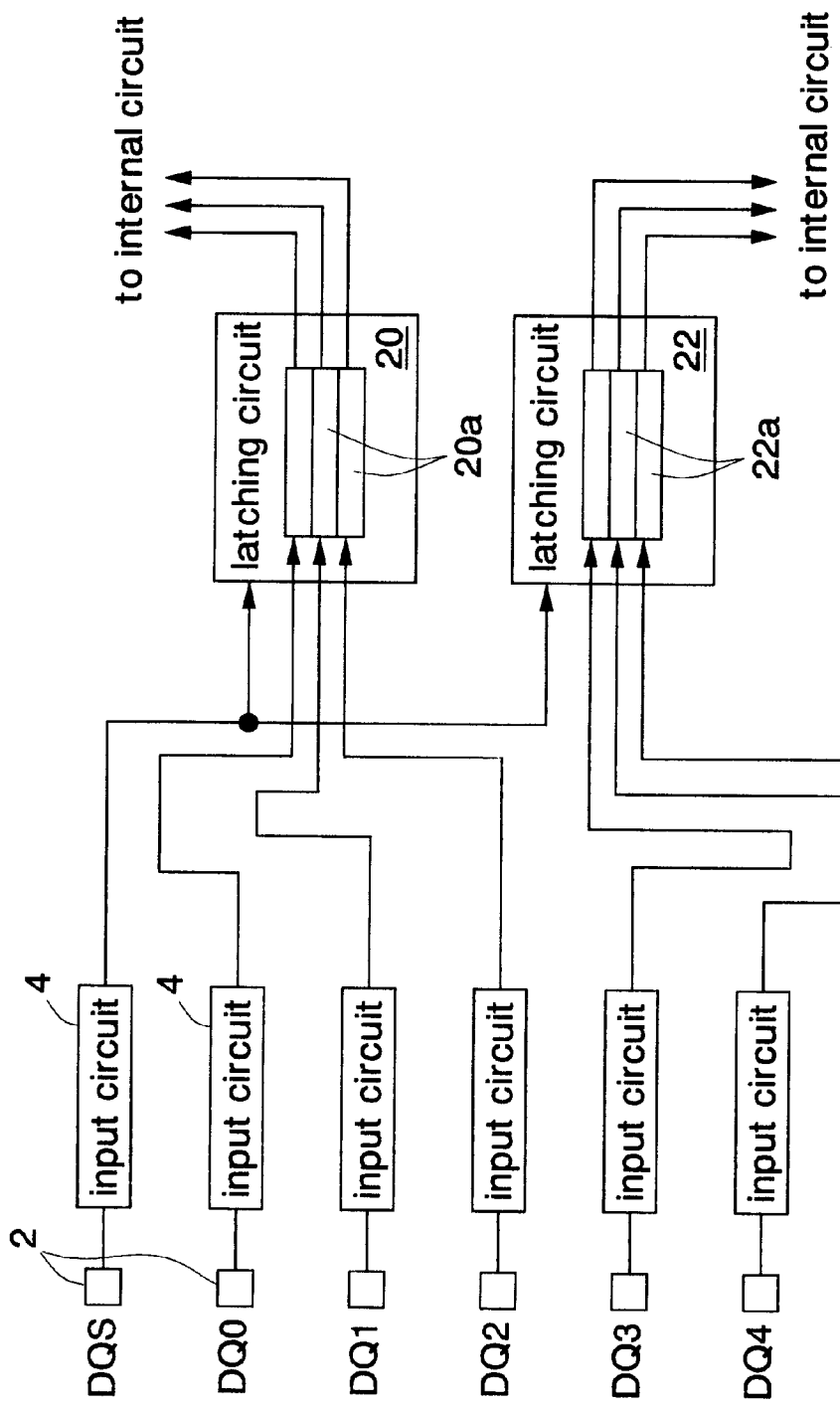
FIG. 5 is a block diagram showing the essential parts of a fourth embodiment of the semiconductor integrated circuit in the present invention.

FIG. 5 shows a fourth embodiment of the semiconductor integrated circuit in the present invention. The same circuits and signals as those described in the conventional art and in the first embodiment will be designated by identical reference numbers, and detailed description thereof will be omitted.

This semiconductor integrated circuit is formed as an SDRAM (Synchronous DRAM) on a silicon substrate by using CMOS processes.

The SDRAM has a plurality of pads 2, input circuits 4 respectively connected to these pads 2, and latching circuits 20 and 22. Aside from those parts shown in the diagram, the SDRAM also includes pads for control signals and data signals, control circuits, memory cell arrays, and so on. The pads 2 are supplied with a data strobe signal DQS(timing signal) and data signals DQ0–DQ5(input signals), respectively. The input circuits 4 receive the above-mentioned signals through the pads 2. The signals received are amplified and output to the latching circuits 20 and 22. The latching circuit 20 has latches 20a corresponding to the data signals DQ0–DQ2, respectively. The latching circuit 20 accepts the data signals DQ0–DQ2 in synchronization with a rising edge of the data strobe signal DQS and outputs the accepted signals to internal circuits. The latching circuit 22 has latches 22a corresponding to the data signals DQ3–DQ5, respectively. The latching circuit 22 accepts the data signals DQ3–DQ5 in synchronization with a rising edge of the data strobe signal DQS and outputs the accepted signals to internal circuits.

Here, the wiring patterns of the data signals DQ0–DQ2, extending from the input circuits 4 to the latching circuit 20, are formed to meander for equal lengths. Likewise, the wiring patterns of the data signals DQ3–DQ5, extending from the input circuits 4 to the latching circuit 22, are formed to meander for equal lengths. That is, the data signals DQ0–DQ2 from the pads 2 to the latching circuit 20 are identical with each other in propagation delay time. The data signals DQ3–DQ5 from the pads 2 to the latching circuit 22 are identical with each other in propagation delay time.

Figure 6:
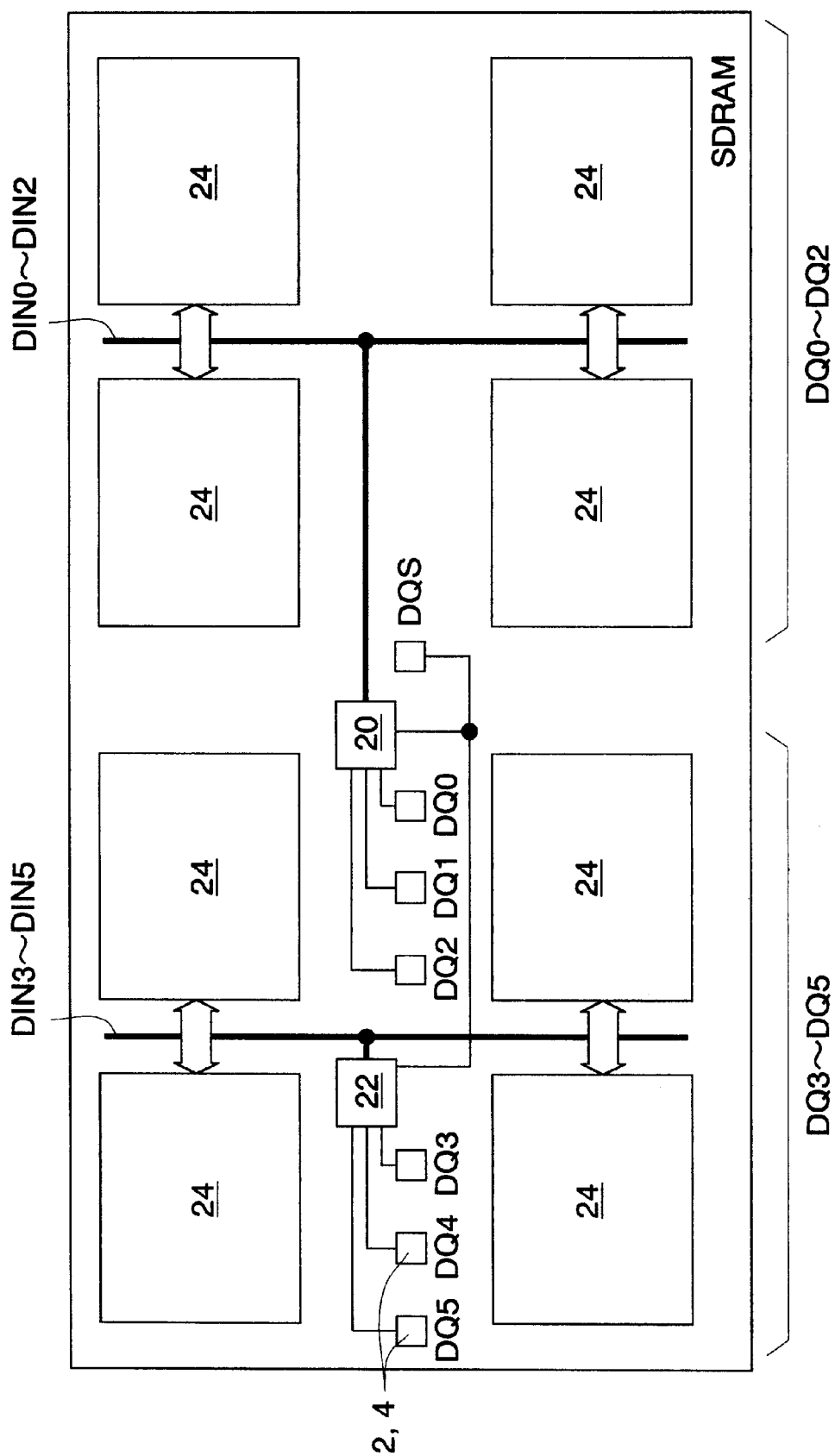
FIG. 6 is a chip layout diagram of the semiconductor integrated circuit of FIG. 5.

FIG. 6 shows the chip layout of the SDRAM.

The SDRAM includes eight memory cell arrays 24 which have a plurality of memory cells, sense amplifiers, and so forth.

The pads 2 for the data signals DQ0–DQ5 and the input circuits 4 are arranged at the center of the left half of the chip, along the lateral direction in the diagram. The latching circuit 20 outputs the accepted data signals DQ0–DQ2 to the memory cell arrays 24 in the right half of the diagram as data input signals DIN0–DIN2. The latching circuit 22 outputs the accepted data signals DQ3–DQ5 to the memory cell arrays 24 in the left half of the diagram as data input signals DIN3–DIN5. That is, the latching circuit 20 is formed for the data signals DQ0–DQ2 that are written into the four memory cell arrays 24 in the right half of the diagram. The latching circuit 22 is formed for the data signals DQ3–DQ5 that are written into the four memory cell arrays 24 in the left half of the diagram. In other words, the latching circuits 20 and 22 are formed in accordance with the layout of the circuits to which the input signals are supplied (the wiring directions of the input-signal wiring patterns). Then, the input signals supplied to each of these latching circuits 20 and 22 each are made equal in wiring pattern length.

The semiconductor integrated circuit in this embodiment can offer the same effects as those obtained from the first embodiment described above. In particular, the input signals can be supplied to internal circuits at optimum timing in accordance with the layout of the internal circuits. At the same time, the layout area of the input-signal wiring patterns can be minimized.

The embodiments described above have dealt with the cases where the present invention is applied to an FCRAM or a DRAM such as an SDRAM. However, the present invention is not limited to such embodiments. For example, the present invention may be applied to SRAMs, ROMs, microcomputers, and the like.

The embodiments described above have dealt with the cases where input-signal wiring patterns are formed in identical lengths so as to be equal in propagation delay time. However, the present invention is not limited to such embodiments. For example, when the wiring patterns differ from each other in width and/or in thickness, identical wiring pattern lengths will not provide the equality in propagation delay time. This fact may be applied to equalizing the propagation delay times by making differences in wiring pattern width and/or in wiring pattern thickness. Here, a further reduction can be made in the layout area of the wiring patterns. Moreover, the material of the wiring patterns may be modified for equal propagation delay times. Specifically, diffusion resistances may be included into the wiring patterns.

Furthermore, the embodiments described above have dealt with the cases where the present invention is applied to a memory of address non-multiplex type. However, the present invention is not limited to such embodiments. For example, the present invention may be applied to a memory of address multiplex type, in which row address signals and column address signals from chip exterior are received in succession.

The invention is not limited to the above embodiments and various modifications may be made without departing from the spirit and scope of the invention. Any improvement may be made in part or all of the components.

What is claimed is:

1. A semiconductor integrated circuit comprising:
   a plurality of signal input pads for receiving input signals;
   a plurality of receiving circuits disposed on the semiconductor integrated circuit at locations different from each other, each for fetching the plurality of input signals in synchronization with a timing signal; and
   a plurality of signal line groups, each group including a plurality of signal lines and being coupled between corresponding signal input pads and a corresponding one of the receiving circuits, wherein
   said signal lines in a same signal line group have equal propagation delay times.

2. The semiconductor integrated circuit according to claim 1, wherein
   said propagation delay time is set by equalizing the lengths of wiring patterns through which said input signals are transmitted.

3. The semiconductor integrated circuit according to claim 1, further comprising decoders respectively corresponding to said receiving circuits, for decoding said input signals received by said receiving circuits.

4. The semiconductor integrated circuit according to claim 3, further comprising a memory cell array having a plurality of memory cells, and wherein
   said input signals are address signals for selecting any of said memory cells.

5. The semiconductor integrated circuit according to claim 1, further comprising internal accepting circuits respectively corresponding to said receiving circuits, for accepting said input signals received by said receiving circuits in synchronization with internal timing signals generated in accordance with operation of internal circuits.

6. The semiconductor integrated circuit according to claim 1, wherein
   said receiving circuits are each formed according to which destination wiring patterns are directed to.

7. The semiconductor integrated circuit according to claim 6, further comprising a memory cell array having a plurality of memory cells, and wherein
   said input signals are data signals to be written to said memory cells.

8. The semiconductor integrated circuit according to claim 1, wherein the plurality of signal input pads comprises:
   a plurality of pad groups corresponding to the number of the receiving circuits, and wherein the signal input pads for a same pad group are disposed closely to each other and the signal input pads for different pad groups are disposed apart from each other.

* * * * *